United States Patent [19]

Ouyang et al.

[11] Patent Number: 4,791,521

[45] Date of Patent: Dec. 13, 1988

[54] METHOD AND APPARATUS FOR REDUCING TRANSIENT NOISE BY PREMAGNETIZATION OF PARASITIC INDUCTANCE

[75] Inventors: Kenneth W. Ouyang, Huntington Beach; Timothy G. O'Shaughnessy, Yorba Linda, both of Calif.

[73] Assignee: Western Digital Corporation, Irvine, Calif.

[21] Appl. No.: 35,345

[22] Filed: Apr. 7, 1987

[51] Int. Cl.$^4$ .............................................. H02H 3/20
[52] U.S. Cl. ....................................... 361/91; 361/111; 307/520; 307/542; 307/296 R
[58] Field of Search ......................... 361/91, 110, 111; 307/200 A, 200 B, 520, 542, 552, 557, 296.6, 296.8; 320/1

[56] References Cited

U.S. PATENT DOCUMENTS

| | | | |
|---|---|---|---|
| 4,023,122 | 5/1977 | Oura | 301/111 |
| 4,322,770 | 3/1982 | Sendelweck | 361/111 X |
| 4,603,268 | 7/1986 | Davis | 307/542 X |
| 4,665,459 | 5/1987 | Bynum et al. | 361/111 X |

FOREIGN PATENT DOCUMENTS

| | | |
|---|---|---|
| 0057239 | 8/1982 | European Pat. Off. |
| 0237139 | 9/1987 | European Pat. Off. |
| 2177865 | 1/1987 | United Kingdom |

OTHER PUBLICATIONS

"Pinout Fuss Yields Quieter Fast CMOS", p. 32, Electronic, Nov.-12-1987.
IBM Technical Disclosure Bulletin, vol. 27, No. 1A, Jun. 1984.

*Primary Examiner*—A. D. Pellinen
*Assistant Examiner*—Derek S. Jennings
*Attorney, Agent, or Firm*—Spensley Horn Jubas & Lubitz

[57] ABSTRACT

The present invention provides an apparatus and method for allowing an electronic device to drive large values of load capacitance without generating high levels of transient noise. Means are provided for passing a first current through the parasitic inductance of the integrated circuit prior to the activation of the output driver, presoaking the parasitic inductance. Thereafter, when the output driver is activated and the load capacitance discharges through the inductance of the integrated circuit, the first current is removed from as the current from the load capacitor replaces it. Since an initial level of current existed through the inductance, the rate of change of current passing through the inductance during activation of the output driver is maintained approximately constant, thereby reducing the level of transient noise generated by the electronic device.

20 Claims, 4 Drawing Sheets

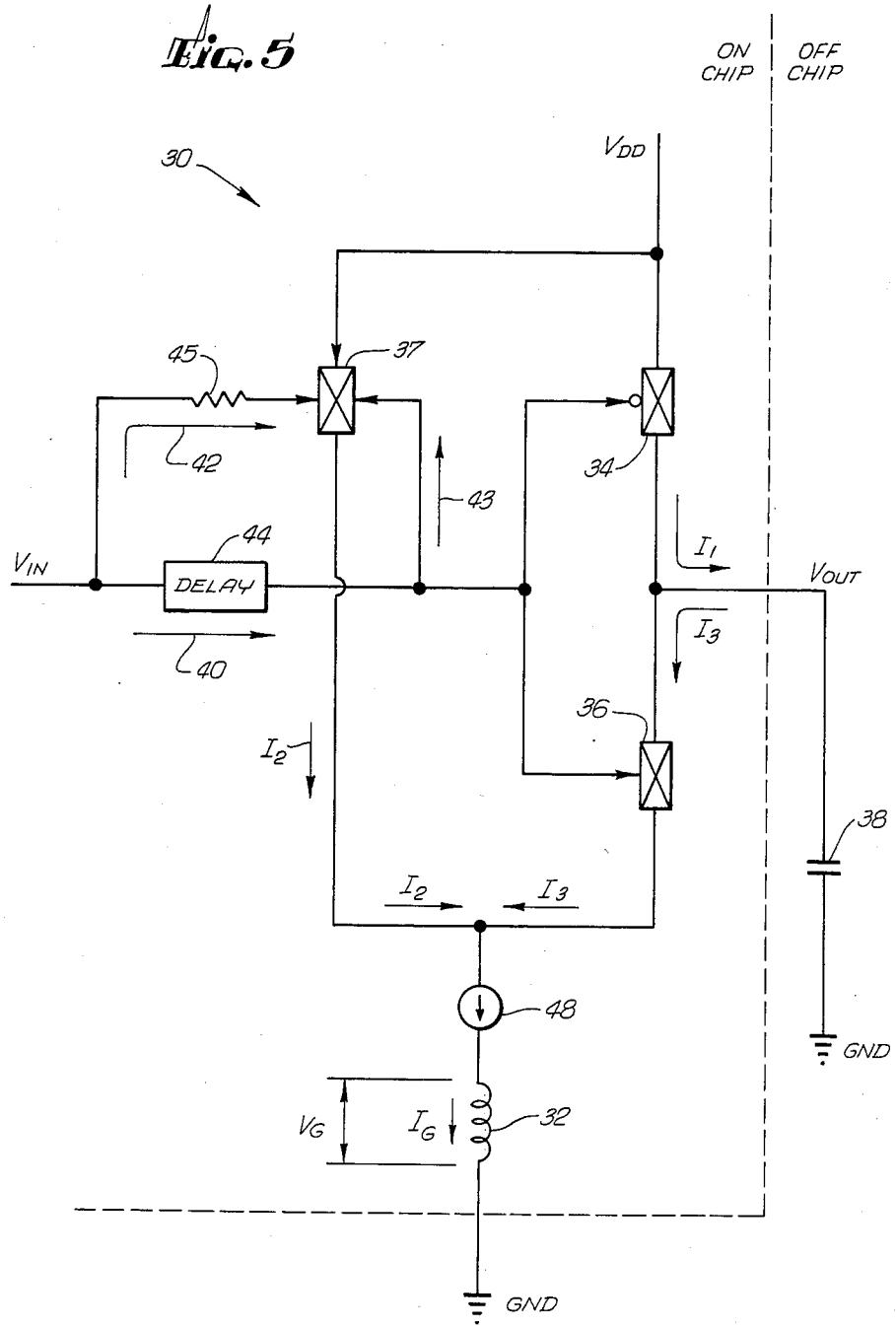

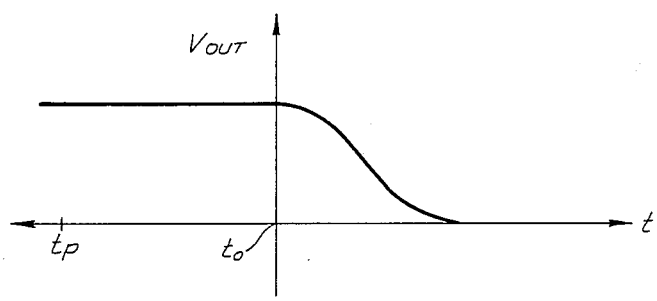
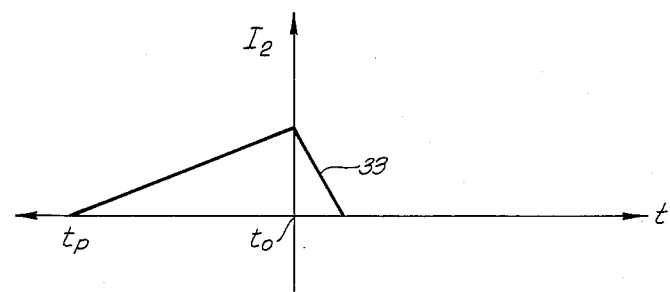
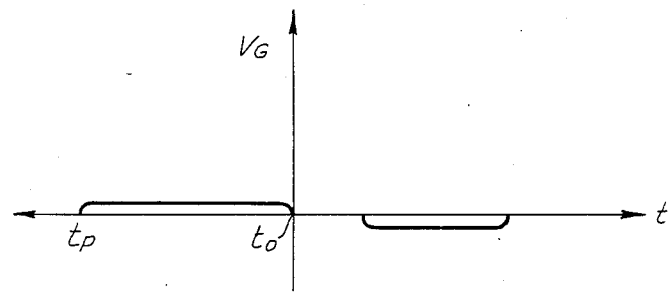
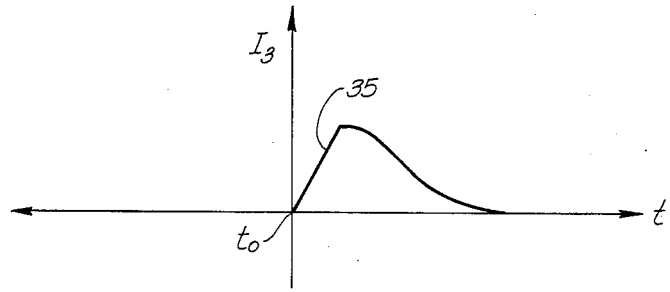

METHOD AND APPARATUS FOR REDUCING TRANSIENT NOISE BY PREMAGNETIZATION OF PARASITIC INDUCTANCE

BACKGROUND OF THE INVENTION

1. Field of the Invention

The present invention relates to a method and apparatus for reducing noise in electronic devices, and more particularly, to a method and apparatus for reducing transient noise generated when electronic devices are switched to drive high output currents.

2. Description of the Prior Art

In many electronic devices and systems, the presence or generation of transient noise is an undesireable consequence of normal operation. although low levels of transient noise may be tolerated under certain operating conditions, transient noise of high levels may result in inaccurate outputs for the electronic devices, or may cause the electronic devices to exceed their operating conditions for a period of time. This may lead to the ultimate failure of the electronic devices and the systems in which they are utilized.

FIG. 1 illustrates an output driver 10 used in a conventional integrated circuit. The output driver 10 is activated by an input voltage $V_{IN}$ received from the logic of the integrated circuit (not shown) and provides an output voltage $V_{OUT}$ used to drive external electronic device. The output driver 10 illustrated includes a parasitic inductance 12 representative of the inductance of the integrated circuit, a first switch 14 and a second switch 16.

Prior to activation of the output driver 10, the first switch 14 is closed and the second switch 16 is open. A power supply voltage $V_{DD}$ is applied to the load capacitance 18 through the first switch 14, allowing the load capacitance 18 to become fully charged, maintaining the output voltage $V_{OUT}$ equal to the power supply voltage $V_{DD}$. The parasitic inductance 12 of the integrated circuit is electrically isolated from the power supply voltage $V_{DD}$ and the load capacitance 18 by the open second switch 16. As illustrated in FIG. 2, the current level $I_G$ passing through the parasitic inductance 12 is therefore initially at a low level. Similarly, the voltage level across the parasitic inductance 12 is also minimal prior to the closing of the switch 16.

At a time which may be referred to as time zero ($t_0$), the input voltage $V_{IN}$ changes state to activate the output driver 10. In response, the first switch 14 begins to open and the second switch 16 begins to close. The fully charged load capacitance 18 therefore begins to discharge very quickly, supplying a current to $I_0$ to the parasitic inductance 12. The level of current $I_G$ passing through the parasitic inductance 12 therefore increases rapidly as a result of the application across the inductance of a voltage approximately a step function at time $t_0$, as illustrated in FIG. 2. Similarly, the output voltage $V_{OUT}$ commences to decrease as the load capacitance 18 discharges over time, as illustrated in FIG. 3.

FIG. 4 illustrates the rate of change of the current $I_G$ passing through the parasitic inductance 12. Due to the rapid increase in the current $I_G$ which occurs at time $t_0$, a spike 19 is created in the rate of change of the current $I_G$. Since noise is proportional to the rate of change of the current $I_G$ passing through the parasitic inductance 12, the spike 19 results in the undesireable generation of a high level of noise.

In recent years, methods and devices have been sought to drive higher and higher values of load capacitance 18. When larger values of load capacitance 18 are made to discharge within the same time period as conventional values of capacitance, higher rates of change of current are experienced through the parasitic inductance 12 electronic device. As a result, even higher levels of transient noise are generated than exit in conventional output drivers.

In addition, faster circuit switching has recently been sought. However, when conventional values of load capacitance are driven within a shorter period of time, higher levels of transient noise are also produced.

Conventional electronic devices have therefore been limited to high speed, high noise applications or low speed, low noise applications.

Some conventional electronic devices have also required the consumption of DC, increasing the total power drain caused by the operation of the electronic devices.

SUMMARY OF THE INVENTION

The present invention provides an apparatus and technique for allowing high speed, low noise switching of electronic devices used to drive high transient current electronic devices. The present invention also allows current switching to occur without the application of DC power. The present invention accomplishes these functions by providing means for maintaining a relatively constant level of current passing through the parasitic inductance of the electronic devices during the switching operations.

More specifically, a switch is provided between the power source and the parasitic inductance of the electronic device. At a predetermined point in time prior to activation of the electronic device, the switch begins to close, providing a current which passes through the parasitic inductance of the electrical device, presoaking it with current. When the electronic device is activated, the switch beings to open, decreasing the level of current passing through the parasitic inductance. Simultaneously, current begins to pass through the parasitic inductance of electronic device from the discharging load capacitance such that the total current passing through the parasitic inductance remains constant due to the offsetting slopes of the currents passing therethrough. Since the rate of change of the current passing through the parasitic inductance is minimized, so too is the level of transient noise generated. In the preferred embodiment of the present invention, the magnitudes of the current passing through the parasitic inductance during the current presoaking period and during switching of the electronic device are equal, resulting in at most a negligible level of transient noise.

BRIEF DESCRIPTION OF THE DRAWINGS

FIG. 5 illustrates a schematic diagram of the output driver of the present invention.

FIG. 6 illustrates the output voltage over time of the output driver illustrated in FIG. 5.

FIG. 7 illustrates the presoaking current level over time.

FIG. 8 illustrates the voltage across the parasitic inductance of the electronic device of the present invention.

FIG. 9 illustrates the current level over time discharged from the load capacitance of FIG. 5.

DESCRIPTION OF THE PREFERRED EMBODIMENT

Figure 1:
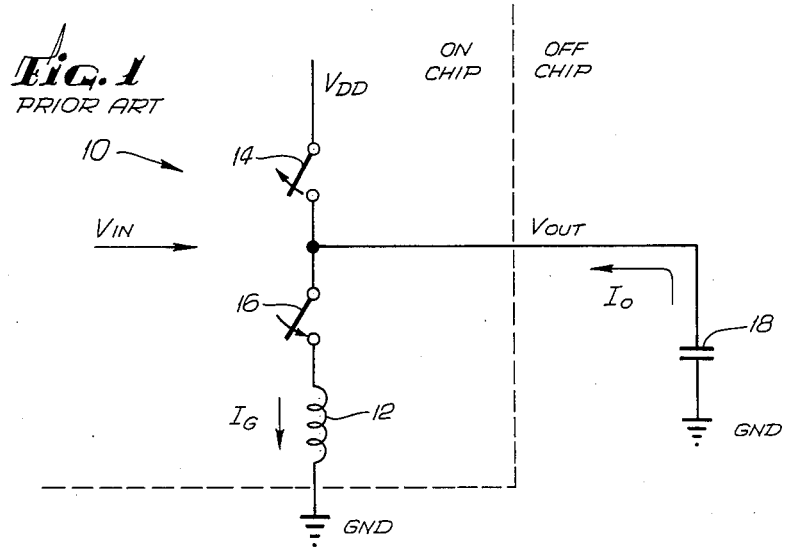
FIG. 1 illustrates a schematic diagram of a conventional output driver of an integrated circuit.
Figure 2:
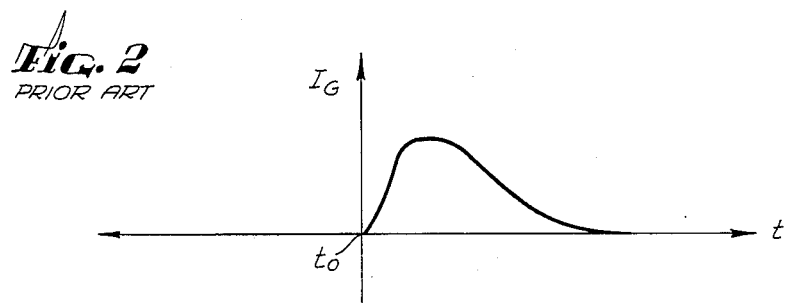
FIG. 2 illustrates the current level over time passing through the parasitic inductance of a conventional integrated circuit having the output driver illustrated in FIG. 1.
Figure 3:
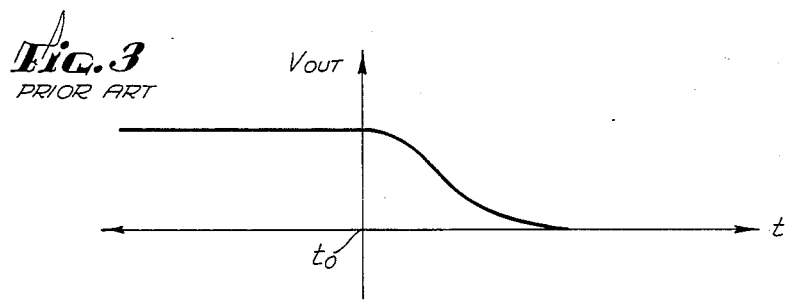
FIG. 3 is illustrates the output voltage level over time of the output driver illustrated in FIG. 1.
Figure 4:
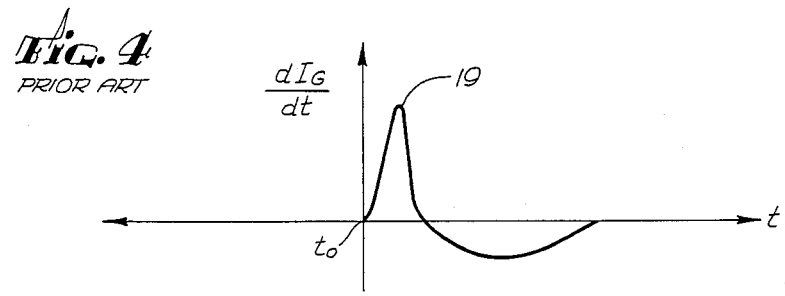
FIG. 4 illustrates the derivative over time of the current level passing through the parasitic inductance of a conventional integrated circuit having the output driver of FIG. 1.

The following description is of the best presently contemplated mode of carrying out the present invention. This description is made for purposes of illustrating the general principles of the invention and is not to be taken in a limiting sense. The scope of the invention is best determined by reference to the appended claims.

The present invention provides a device and a method for reducing transient noise generated during activation of an electronic device. The present invention is unconventional in that the inductance of the electronic device is presoaked with current prior to the time at which the electronic device is activated, thereby minimizing the rate of change of the current passing through the parasitic inductance when the load capacitance is allowed to discharge.

The present apparatus and method are applicable to all electronic devices which drive high output current. For simplicity, however, the present invention will be described below with respect to output drivers used in integrated circuits.

Operation of the output driver 30 is described below with respect to three time frames. The first time frame elapses at a preselected time $t_p$ prior to the commencement the activation of the output driver 30. The second time frame is a current presoaking period which commences at time $t_p$ and ends at time zero ($t_0$) when activation of the output driver 30 is commenced. The final time frame begins when activation of the output driver 30 is commenced at time $t_0$, and includes all time thereafter.

Referring to FIG. 5, the electronic device of the present invention includes an output driver 30 having a power supply (not illustrated) which generates a power supply voltage $V_{DD}$. A first switch 34 is provided between the power supply and an load capacitance 38 representative of the capacitance of the electrical device(s) being driven. A second switch 36 is provided between the load capacitance 38 and the parasitic inductance 32 representative of any internal or external parasitic inductance connected to the output driver 30. In addition, a third switch 37, which in a preferred embodiment is matched with the second switch 36, is provided between the power supply and the parasitic inductance 32.

During the first time frame prior to time $t_p$, the first switch 34 is closed, allowing the power supply voltage $V_{DD}$ to be applied to the load capacitance 38. The load capacitance 38 may therefore become fully charged by a first current $I_1$, allowing the output voltage $V_{OUT}$ to attain its maximum limit, as illustrated in FIG. 6. The second switch 36 is open, electrically isolating the parasitic inductance 32 from the load capacitance 32. Similarly, the third switch 37 is open, electrically isolating the parasitic inductance 32 from the power supply voltage $V_{DD}$.

The current presoaking period commences at time $t_p$ when the activation input voltage $V_{IN}$ received from the logic of the circuit (not shown) changes state. The input voltage $V_{IN}$ is applied to two paths, with the first path 40 leading to a delay mechanism 44. The delay mechanism may be formed, for example, of a plurality of in series inverters. The second path 42 leads to the switch 37. Application of the changed state input voltage $V_{IN}$ to the second path 42 results in switch 37 commencing to close, allowing the power supply voltage $V_{DD}$ to be applied to the parasitic inductance 32. A current $I_2$ therefore begins to flow through the switch 37, presoaking the parasitic inductance 32, as illustrated in FIG. 7. A resistance element 45 is provided along the second path 42 in order to assure smooth closing of the switch 37, thereby providing a linear transition in the level of current $I_2$ passing through the parasitic inductance 32, minimizing its rate of change and the noise which is thereby generated. The voltage level $V_G$ across the parasitic inductance 32, which is proportional to the rate of change of the current $I_G$ passing through the parasitic inductance 32, remains constant during this period of time due to the linear increase in the current $I_G$ as illustrated in FIG. 8.

The third time period commences when the output driver 30 is activated at time $t_0$. This occurs when the changed state input voltage $V_{IN}$ is no longer delayed by the delay mechanism 44 located along the first path 40. When this event occurs, which may be varied by selection of an appropriate delay time for the delay mechanism 44, an appropriate voltage signal is applied to the third path 43 to begin opening the switch 37, thereby commencing to electrically isolate the inductance 32 of the integrated circuit from the power supply voltage $V_{DD}$. The flow of the current $I_2$ passing through the parasitic inductance 32 begins to quickly decrease, as illustrated by numeral 33 in FIG. 7. The delayed input voltage signal is also applied to the first switch 34 which commences to open and allow the load capacitance 38 to become electrically isolated from the power supply voltage $V_{DD}$. The second switch 36 also commences to close to create an electrical connection between the load capacitance 38 and the parasitic inductance 32 of the integrated circuit. The load capacitance 38 thus commences to discharge through the second switch 36, generating an initially increasing value of current $I_3$ which passes through the parasitic inductance 32 of the integrated circuit, as illustrated by numeral 35 in FIG. 9.

Figure 10:
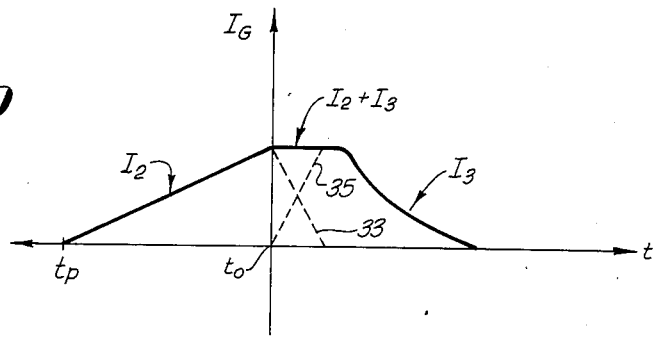
FIG. 10 illustrates the current level over time passing through the parasitic inductance of the electronic device in a first application of the present invention.

The total value of the current $I_G$ passing through the parasitic capacitance 32 at any time is thus equal to the total of the current $I_2$ from the power supply and the current $I_3$ from the load capacitance. As illustrated in FIG. 10, if the switches 36 and 37 are chosen as a matched pair with the same switching speed, and the second switch 36 commences to close simultaneously with the commencement of the opening of the switch 37 at time $t_0$, the current $I_G$ should remain approximately constant during the switching operation. The rate of change of the current passing through the parasitic inductance 32, as well as the the transient noise generated, will therefore be negligible or zero. This constitutes the preferred embodiment of the present invention.

Figure 11:
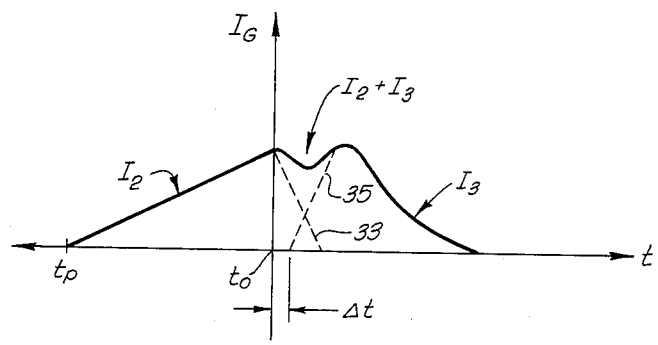
FIG. 11 illustrates the current level over time passing through the parasitic inductance of the electronic device in a second application of the present invention.

Alternately, it is possible that switches 36 and 37 are not a matched pair and have different switching speeds, or that the second switch 36 does not commence to close simultaneously with the commencement of opening of switch 37. In such cases, it is possible that the total level of current $I_G$ passing through the parasitic capacitance 32 may not be exactly constant, and some level of switching noise may be generated. This level of switching noise, however, may still be less than that experienced by conventional switching mechanisms under the same operating conditions. FIG. 11 illustrates the case in which the second switch 36 commences to close a short time $\Delta t$ after matched switch 37 commences to open.

It is also preferred that the maximum values of the current $I_2$ and $I_3$ are equal, as illustrated in FIG. 10. If they are not of the same magnitude, however, this does not preclude the establishment of transient noise levels which are still lower than those achievable with conventional electronic devices.

FIG. 5 also illustrates an optional current source 48 located on the ungrounded end of the inductance 48 of the integrated circuit. The current source 48 improves the operation of the output driver 30 of the present invention by more accurately maintaining a preselected maximum level of current passing through the parasitic inductance 32 during switching. During the first time period, the current source 48 is inactive and passes no current through the parasitic inductance 32. During the current presoaking time period, however, the switch 37 begins to close and the power supply voltage $V_{DD}$ is applied to the current source 48, activating it. A fixed current is therefore generated by the current source 48 which is delivered to the parasitic inductance 32. During the third time period during switching, the power supply voltage $V_{DD}$ commences becoming electrically isolated that from the fixed current source 48 by the open switch 37. The fixed current source 48 therefore decreases its output current, and the current flowing through the parasitic inductance 32 due the switch 37 begins to rapidly decrease. Simultaneously, however, the delayed changed state input voltage signal $V_{IN}$ begins to close the switch 36, allowing the output voltage $V_{OUT}$ to be applied to the current source 48, biasing the current source 48 to output more current at the same time that the current source 48 is outputting less current due to the opening of switch 37. The total current $I_G$ passing through the parasitic inductance from the current source 48 thus remains approximately constant. The current source 48 thus assures that a relatively constant maximum level of current will pass through the integrated circuit during the activation of the output driver 30, thereby reducing the noise generated during activation of the output driver.

The circuit illustrated in FIG. 5 thus decreases the level of transient noise generated during activation of the output driver 30 by presoaking the parasitic inductance 32 with a current prior to activation of the output driver 30. When the output driver is activated, the presoaking current is reduced as the current discharged from the load capacitance 38 increases. The switching operation is also accomplished without the necessity of providing DC power.

Figure 12:
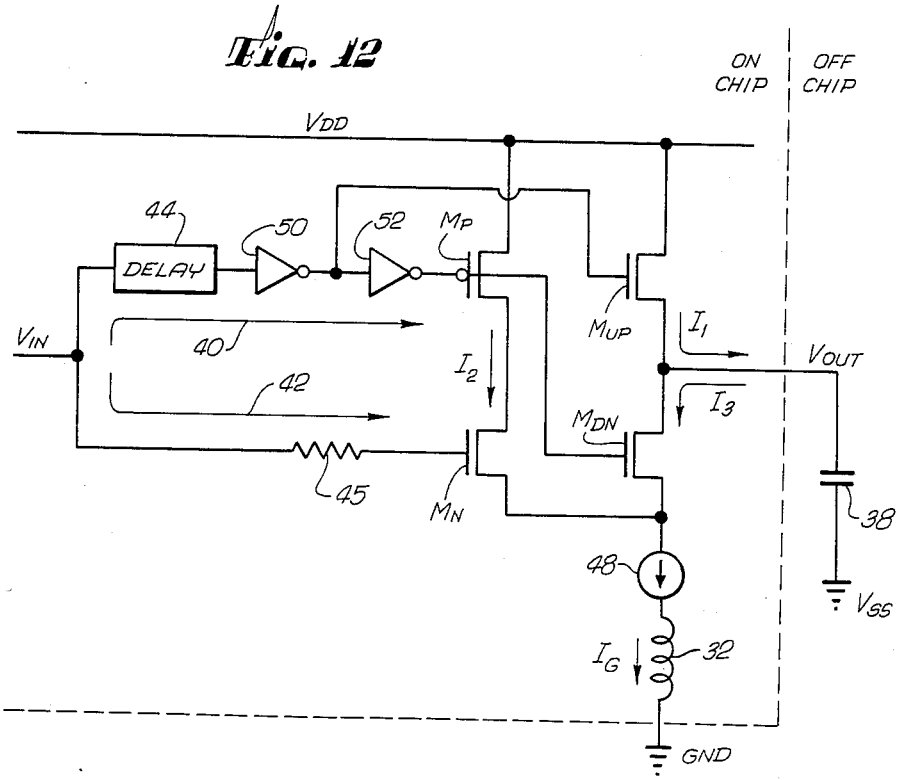
FIG. 12 illustrates a more detailed schematic diagram of the output driver illustrated in FIG. 5.

FIG. 12 illustrates the integrated circuit of FIG. 5 in more detail, wherein the switches 34, 36 and 37 illustrated in FIG. 5 have been replaced with MOSFET transistors $M_P$, $M_N$, $M_{UP}$ and $M_{DN}$ and the output driver is formed as an active high output driver. More specifically, during the first time frame prior to activation of the output driver 30, the input voltage $V_{IN}$ is low. Accordingly, N-channel transistor $M_N$ is nonconductive, electrically isolating the parasitic inductance 32 from the power supply voltage $V_{DD}$. The low input voltage signal $V_{IN}$ is inverted by an inverter 50, maintaining the N-channel transistor $M_{UP}$ conductive, electrically connecting the load capacitance 38 with the power supply voltage $V_{DD}$. The input voltage signal is further inverted by the inverter 52, maintaining P-channel transistor $M_P$ conductive and the N-channel transistor $M_{DN}$ nonconductive. The parasitic inductance 32 of the device is therefore electrically isolated from the power supply voltage $V_{DD}$ as the power supply voltage $V_{DD}$ is applied to the load capacitance 38. The entire circuit thus draws zero direct current.

During the current presoaking time period, the high input voltage signal $V_{IN}$ is generated by the logic of the circuit and is applied to both the time delay path 40 and the second path 42. The N-channel transistor $M_N$ commences to become conductive, electrically connecting the parasitic inductance 32 with the power supply voltage $V_{DD}$. The current source 48 commences to be activated, supplying a fixed current to the parasitic inductances 32, presoaking it. Transistors $M_P$, $M_{UP}$ and $M_{DN}$ remain unaffected by the activating input voltage $V_{IN}$ during the current presoaking time period.

After the presoaking period has elapsed, the high input voltage $V_{IN}$ is no longer delayed by the delay mechanism 44. The twice inverted high input voltage $V_{IN}$ commences to make transistor $M_P$ nonconductive, eliminating the electrical connection between the power supply voltage $V_{DD}$ and the current source 48. The current source 48 therefore commences to deactivate. In addition, the inverted high input voltage $V_{IN}$ is applied to transistor $M_{UP}$, commencing to make it nonconductive. Moreover, the twice inverted input voltage $V_{IN}$ is also applied to transistor $M_{DN}$, making it commences to be conductive. An electrical connection is thereby created between the current source 48 and the load capacitance 38. As the load capacitance 38 begins to discharge, the output voltage $V_{OUT}$ increasingly biases the current source 48 to be activated. Ideally, the initially increasing output voltage $V_{OUT}$ biases the current source 48 to make up for its deactivation due to the increasingly nonconductive transistor $M_P$ such that the current source 48 outputs a constant level of current during the switching operation. Since the same total fixed level of current is applied to the parasitic inductance 32 throughout the switching operation, the rate of change of the current passing through the parasitic inductance 32 is zero or some minimum value. The transient noise generated by activation of the output driver 30 is therefore minimized.

The invention has been described and illustrated with respect to ground noise generated when the electronic device being driven is allowed to discharge through the ground inductance during a switching operation. As can easily be envisioned, the invention is also applicable to the reduction or elimination of power supply switching noise created when the electrical device being driven is initially charged through the power supply inductance by a switching operation. Ideally, presoaking of both the power supply inductance and the ground inductance may occur to reduce or eliminate all switching noise in the electronic device.

We claim:

1. A circuit for reducing transient noise generated by a first electronic device while the first electronic device drives a second electronic device, said second electronic device having a capacitance, said first electronic device having a parasitic inductance, an input terminal for activating the first electronic device and an output terminal for driving the second electronic device, said circuit comprising:

supply means for supplying a power supply voltage;

first switching means, operatively coupled to the input terminal, the supply means and the output terminal, for applying said power supply voltage to said capacitance of said second electronic device prior to activation of said first electronic device, thereby charging said capacitance of said second electronic device;

second switching means, operatively coupled to the input terminal, the supply means and the parasitic inductance, for electrically connecting said power supply voltage to said parasitic inductance of said first electronic device prior to activation of said first electronic device;

third switching means, operatively coupled to the input terminal, the supply means and the parasitic inductance, for electrically disconnecting said power supply voltage from said parasitic inductance of said first electronic device upon activation of said first electronic device; and fourth switching means, operatively coupled to the input terminal, the output terminal and the parasitic inductance, for electrically connecting said capacitance of said second electronic device with said parasitic inductance of said first electronic device upon activation of said first electronic device.

2. An output driver in an integrated circuit for reducing the level of transient noise generated by the integrated circuit during the driving of an external electrical device in response to an input signal, where the external electrical device has a characteristic capacitance and the integrated circuit has a parasitic inductance, the output driver comprising:

power supply means for supplying electrical power;

an input terminal for receiving the input signal;

an output terminal for connecting the output driver to the external electrical device;

first switch means, coupled to the power supply means and the parasitic inductance, for selectively electrically connecting the power supply means with the parasitic inductance of the integrated circuit;

second switch means, coupled to the power supply means and the output terminals, for selectively electrically connecting the power supply means with the external electrical device;

third switch means, coupled to the output terminal and the parasitic inductance, for selectively electrically connecting the external electrical device and the parasitic inductance of the integrated circuit; and delay means, coupled to the input terminal and the second and third switch means, for delaying the activation of the second and third switch means for a predetermined amount of time after activation of the first switch means.

3. An output driver according to claim 2, wherein the first, second, and third switch means comprise transistors.

4. An output driver according to claim 3, wherein the first, second and third switching means comprise MOSFET transistors.

5. An output driver in an integrated circuit for reducing the level of transient noise generated by the integrated circuit during the driving in response to a supplied input signal of an external electronic device having a characteristic capacitance, the integrated circuit having a parasitic inductance, the output driver comprising:

power supply means for supplying electrical power;

current source means for supplying current of a predetermined maximum magnitude;

an input terminal for receiving the input signal;

an output terminal for connecting the output driver to the the external electronic device;

first switch means, coupled to the power supply means and the current source means, for selectively electrically connecting the power supply means with the current source means, thereby selectively activating the current source means to supply a first current of a predetermined maximum magnitude to the parasitic inductance of the integrated circuit;

second switch means, coupled to the power supply means and the output terminal, for selectively electrically connecting the power supply means and the external electronic device, thereby electrically charging the capacitance of the external electronic device;

third switch means, coupled to the output terminal and the current source means, for electrically connecting the external electronic device and the current source means, thereby selectively activating the current source means to supply a second current of a predetermined maximum magnitude through the output terminal to the parasitic inductance of the integrated circuit as the characteristic capacitance of the external electronic device discharges; and delay means, coupled to the input terminal and the second an third switch means, for delaying the activation of the second and third switch means for a predetermined amount of time after activation of the first switch means.

6. An output driver according to claim 5, wherein said first, second and third switching means comprise transistors.

7. An output driver according to claim 5, wherein said first, second and third switching means comprise MOSFET transistors.

8. A method for reducing the level of transient noise generated by an integrated circuit during the driving of an external electronic device having a characteristic capacitance, comprising the steps of:

(1) providing an integrated circuit having a parasitic inductance, power supply terminals for supplying a power supply voltage and a bias current, and an output driver connected to the external electronic device, the power supply terminals and the parasitic inductance;

(2) charging the capacitance of the external electronic device with the power supply voltage;

(3) passing the bias current through the parasitic inductance to thereby presoak the inductance, and (4) approximately simultaneously (a) commencing to reduce the magnitude of the bias current through the parasitic inductance and (b) commencing to drive the external electronic device to allow the charged capacitance of the external electronic device to discharge through the parasitic inductance.

9. A method for reducing the transient noise generated during activation of an electronic device, said electronic device having a parasitic inductance, said method consisting of:
providing current means for passing a current of predetermined value through said parasitic inductance of said electronic device;
activating said current means at a predetermined amount of time prior to activation of said electronic device, thereby presoaking said parasitic inductance with current;
activating said electronic device; and
deactivating said current means when said electronic device is activated.

10. A method for passing an operating current having a steep transition through a current path including an inductive portion, comprising:
premagnitizating the inductive portion prior to the arrival of the steep transition by supplying a presoak current; and
switching the presoak current in opposition to the steep transition of the operating current such that the net effect of both the steep transistion and the opposingly switched portion of the presoak current on the magnetization of the inductive portion is substantially less than that of the steep transition by itself.

11. A current passing method according to claim 10 wherein the step of supplying the presoak current includes changing the magnitude of the presoak current prior to the arrival of the steep transition at a rate of change which is substantially less than that of the steep transition.

12. The current passing method of claim 11 wherein the rate of magnitude change of the presoak current prior to the arrival of the steep transistion is a predetermined constant.

13. A current passing method according to claim 12 wherein the switching of the presoak current is matched to the steep transition of the operating current such that the net effect of the steep transition and the opposingly switched portion of the presoak current on the magnetization of the inductive portion is minimized.

14. A current conducting circuit for passing a first current having a changing magnitude through a current path having an inductive portion, comprising:
presoak means, coupled to the current path, for passing a second current through the inductive portion of the current path prior to the passage of the first current through the current path; and
switchover means, coupled to the presoak means, for changing the magnitude of the second current in opposition to the magnitude change of the first current when the first current is introduced into the current path such that for total current flowing through the inductive portion, the magnitude change of the first current is at least partially offset by the magnitude change of the second current.

15. A current conducting circuit according to claim 14 further comprising:
introducing means for introducing the first current into the current path, wherein the introducing means and the switchover means are matched to one another such that the absolute rate of change in the magnitude of the first current is substantially the same as the absolute rate of change in the magnitude of the second current.

16. A current conducting circuit according to claim 14 further comprising linear change means, operatively coupled to the presoak means, for causing the second current to change magnitude at a substantially constant rate as it passes through the inductive portions prior to the introduction of the first current.

17. A current conducting circuit according to claim 16 wherein the rate of change in the magnitude of the second current prior to the passage of the first current is substantially less than the rate of change of the later introduced first current.

18. A capacitor discharging circuit for discharging a charged capacitor through a discharge path including an inductive portion and a first switch, the first switch having a first actuating means for closing the first switch to thereby discharge the capacitor through the discharge path, comprising:
anticipation means, operatively coupled to the first actuating means, for producing a preactuation signal prior to the closing of the first switch; and
a second switch, operatively coupled to supply a presoak current to the inductive portion of the discharge path and having a second actuating means for closing and opening the second switch, wherein the second actuating means is connected to respond to the preactuation signal of the anticipation means such that the second switch commences to close prior to the closing of the first switch and the second switch commences to open at approximately the same time as the first switch commences to close.

19. The capacitor discharging circuit of claim 18 wherein the first and second switches are transistors.

20. A method for reducing switching noise in an electronic circuit where said switching noise develops from the introduction of a rapidly changing current into an inductive portion of the electronic circuit, comprising:
presoaking the inductive portion with a presoak current prior to the introduction of the rapidly changing current; and
changing the magnitude of the presoak current in opposition to the magnitude change of the rapidly changing current as the latter is introduced into the inductive portion so that the combined rate of change of the presoak current and the rapidly changing current is less than the rate of change of the latter current alone, thereby causing the amount of switching noise developed by the inductive portion to be less than the amount of switching noise that would be developed by the inductive portion as a result of the rapidly changing current alone.

* * * * *